US012666763B2

(12) United States Patent
Yu et al.

(10) Patent No.: US 12,666,763 B2
(45) Date of Patent: Jun. 23, 2026

(54) LIGHT EMITTING DISPLAY DEVICE

(71) Applicant: LG Display Co., Ltd., Seoul (KR)

(72) Inventors: Jae Choul Yu, Seoul (KR); Jeong Oh Kim, Seoul (KR); Myung Jae Yoo, Seoul (KR); Geum Young Lee, Seoul (KR); Seong Ho Kang, Seoul (KR)

(73) Assignee: LG Display Co., Ltd., Seoul (KR)

( * ) Notice: Subject to any disclaimer, the term of this patent is extended or adjusted under 35 U.S.C. 154(b) by 334 days.

(21) Appl. No.: 18/236,461

(22) Filed: Aug. 22, 2023

(65) Prior Publication Data

US 2024/0204143 A1      Jun. 20, 2024

(30) Foreign Application Priority Data

Dec. 16, 2022      (KR) ........................ 10-2022-0177594

(51) Int. Cl.
| | |
|---|---|
| *H01L 33/42* | (2010.01) |
| *H01L 33/00* | (2010.01) |
| *H01L 33/38* | (2010.01) |
| *H10H 20/00* | (2025.01) |
| *H10H 20/01* | (2025.01) |
| *H10H 20/831* | (2025.01) |
| *H10H 20/833* | (2025.01) |

(52) U.S. Cl.
CPC .......... *H10H 20/833* (2025.01); *H10H 20/01* (2025.01); *H10H 20/052* (2025.01); *H10H 20/8316* (2025.01); *H10H 20/036* (2025.01)

(58) Field of Classification Search
CPC . H01L 33/42; H01L 33/0037; H01L 33/0095; H01L 33/387
See application file for complete search history.

(56) References Cited

U.S. PATENT DOCUMENTS

| | | | |
|---|---|---|---|
| 2006/0066796 A1* | 3/2006 | Ohashi .................. | G02F 1/1368 349/139 |
| 2010/0201253 A1* | 8/2010 | Cok ..................... | H10K 59/123 313/504 |
| 2014/0151651 A1 | 6/2014 | Jin et al. | |
| 2017/0125738 A1 | 5/2017 | Kim et al. | |

(Continued)

FOREIGN PATENT DOCUMENTS

| | | |
|---|---|---|
| JP | 2004-235019 A | 8/2004 |
| JP | 2007-080673 A | 3/2007 |

(Continued)

OTHER PUBLICATIONS

Office Action in Japanese Appln. No. 2023-149888, mailed on Apr. 8, 2025, 9 pages (with English translation).

(Continued)

*Primary Examiner* — Joseph L Williams
(74) *Attorney, Agent, or Firm* — PnK IP LLC

(57) ABSTRACT

A light emitting display device includes a plurality of sub-pixels each including an emission area and a non-emission area, an anode including a first transparent electrode and a second transparent electrode at each of the plurality of sub-pixels, to overlap with the emission area and a portion of the non-emission area, a plurality of protrusion patterns inside an edge line of the second transparent electrode between the first transparent electrode and the second transparent electrode, and a bank to expose the emission area and a first area of the non-emission area.

19 Claims, 13 Drawing Sheets

1000

(56) References Cited

U.S. PATENT DOCUMENTS

2019/0067642 A1    2/2019  Kim et al.
2022/0208904 A1    6/2022  Lee et al.

FOREIGN PATENT DOCUMENTS

| JP | 2022-080093 | A | 5/2022 |
| KR | 10-2016-0006110 | A | 1/2016 |
| KR | 10-2017-0026949 | A | 3/2017 |
| KR | 10-2017-0036155 | A | 4/2017 |
| KR | 10-2021-0086157 | A | 7/2021 |

OTHER PUBLICATIONS

Japanese Office Action dated Oct. 1, 2024 issued in Patent Application No. 2023-149888 (7 pages).

* cited by examiner

LIGHT EMITTING DISPLAY DEVICE

CROSS-REFERENCE TO RELATED APPLICATION

This application claims the priority of Korean Patent Application No. 10-2022-0177594, filed on Dec. 16, 2022, which is hereby incorporated by reference in its entirety.

BACKGROUND

Field of the Disclosure

The present disclosure relates to a display device, and more particularly to a light emitting display device capable of preventing leakage current from flowing between adjacent sub-pixels while achieving an enhancement in luminous efficacy of an emission area.

Description of the Background

An image display device, which realizes presentation of information on a screen, is a core technology in the information communication era. In connection with this, various display devices having excellent performance such as thinness, lightness, and low power consumption are being continuously developed.

Among such display devices, a light emitting display device may achieve lightness and thinness because the light emitting display device includes a light emitting element, which is a self-luminous element that does not require a separate light source for the light emitting element.

The light emitting element is configured through inclusion of an intermediate layer (i.e., light emission layer) between an anode and a cathode. When an electric field is applied between the anode and the cathode, light is emitted from the intermediate layer, and is then discharged out of the light emitting display device after passing through various constituent elements.

However, a part of the light emitted from the light emitting element may be trapped within the light emitting display device without being discharged out of the light emitting display device. As a result, a problem of degradation in light extraction efficiency of the light emitting display device may occur.

Furthermore, in the light emitting display device, which includes the light emitting element, there may be a problem in that a part of plural sub-pixels may emit light due to leakage current.

The above information disclosed in this Background section is only for enhancement of understanding of the background of the described technology and therefore it may contain information that does not form prior art that is already known to a person of ordinary skill in the art.

SUMMARY

Accordingly, the present disclosure is directed to a light emitting display device that substantially obviates one or more problems due to limitations and disadvantages of the related art.

The present disclosure relates to a light emitting display device capable of preventing leakage current from flowing between adjacent sub-pixels while achieving an enhancement in luminous efficacy of an emission area.

The light emitting display device of the present disclosure includes a plurality of protrusion patterns between a first transparent electrode and a second transparent electrode included in each of sub-pixels, thereby preventing leakage current from flowing between adjacent ones of the sub-pixels while achieving an enhancement in luminous efficacy of an emission area.

Additional advantages and features of the disclosure will be set forth in part in the description which follows and in part will become apparent to those having ordinary skill in the art upon examination of the following or may be learned from practice of the disclosure. Other advantages of the disclosure may be realized and attained by the structure particularly pointed out in the written description and claims hereof as well as the appended drawings.

To achieve these and other advantages and in accordance with the disclosure, as embodied and broadly described herein, a light emitting display device includes a plurality of sub-pixels each including an emission area and a non-emission area, an anode including a first transparent electrode and a second transparent electrode at each of the plurality of sub-pixels, to overlap with the emission area and a portion of the non-emission area, a plurality of protrusion patterns inside an edge line of the second transparent electrode between the first transparent electrode and the second transparent electrode, and a bank to expose the emission area and a first area of the non-emission area.

In another aspect of the present disclosure, a method of manufacturing a light emitting display device includes forming a plurality of sub-pixels each including an emission area and a non-emission area; forming a second transparent electrode at each of the plurality of sub-pixels that overlaps with the emission area and a portion of the non-emission area; forming a plurality of protrusion patterns inside an edge line of the second transparent electrode under the second transparent electrode; forming a first transparent electrode under the plurality of protrusion patterns that overlaps with the second transparent electrode; forming a bank on the second transparent electrode that exposes the emission area and a first area of the non-emission area; and forming a barrier layer between the second transparent electrode and the bank.

In a further aspect of the present disclosure, a light emitting display device includes a plurality of sub-pixels each including an emission area and a non-emission area defined in a substrate; an anode including a first transparent electrode and a second transparent electrode that have a portion overlapping in the emission area and the non-emission area; a light emission layer disposed on the anode; and a plurality of light emission enhancing dots disposed between the first and second transparent electrodes in the emission area and the non-emission area, wherein the plurality of light emission enhancing dots has a refractive index lower than those of the first and second transparent electrodes and refracts light emitted from the light emission layer toward the substrate in the emission area.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate aspect (s) of the disclosure and along with the description serve to explain the principle of the disclosure. In the drawings.

DETAILED DESCRIPTION

Figure 1:
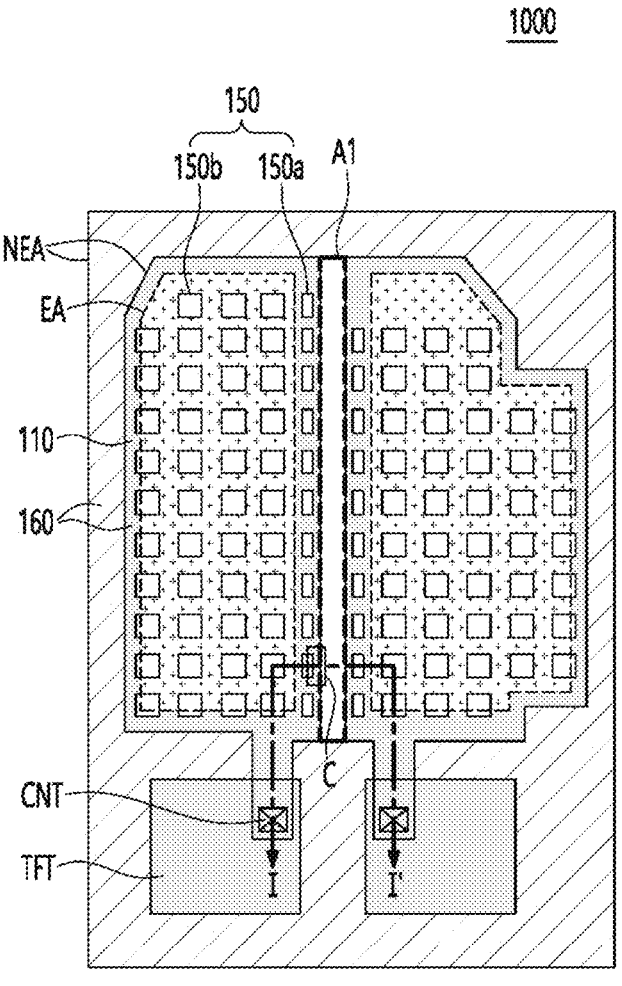
FIG. 1 is a plan view of a light emitting display device according to an aspect of the present disclosure.

Advantages and features of the present disclosure, and implementation methods thereof will be clarified through following aspects described with reference to the accompanying drawings. The present disclosure may, however, be embodied in different forms and should not be construed as limited to the aspects set forth herein. Rather, these aspects are provided so that this disclosure will be thorough and complete, and will fully convey the scope of the present disclosure to those skilled in the art. Further, the present disclosure is only defined by the scope of claims.

The shapes, sizes, ratios, angles, numbers, and the like disclosed in the drawings for describing various aspects of the present disclosure are merely examples, and thus, the present disclosure is not limited to the illustrated details. Like reference numerals refer to like elements throughout. In the following description, when the detailed description of the relevant known function or configuration is determined to unnecessarily obscure aspects of the present disclosure, the detailed description will be omitted.

When "comprise," "have," and "include" described in the present disclosure are used, another part may be added unless "only" is used. Terms in a singular form may include plural forms unless stated to the contrary.

In construing an element, the element is construed as including an error or tolerance range although there is no explicit description of such an error or tolerance range.

In describing a positional relationship, for example, when a positional relation between two parts is described as, for example, "on," "over," "under," and "next," one or more other parts may be disposed between the two parts unless a more limiting term, such as "just" or "direct(ly)" is used.

In describing a temporal relationship, for example, when the temporal order is described as, for example, "after," "subsequent," "next," and "before," a situation that is not continuous may be included unless a more limiting term, such as "just," "immediate(ly)," or "direct(ly)" is used.

It will be understood that, although the terms "first," "second," etc. may be used herein to describe various elements, these elements should not be limited by these terms. These terms are only used to distinguish one element from another, and may not define order. For example, a first element could be termed a second element within the scope of the present disclosure.

In the following description of the aspects, "first horizontal axis direction," "second horizontal axis direction" and "vertical axis direction" should not be interpreted as having only geometrical relations in which parts are perpendicular to each other, and may mean wider orientations within the ranges in which elements of the disclosure functionally work.

The term "at least one" should be understood as including all combinations presented by one or more of associated elements. For example, "at least one of a first element, a second element or a third element" may not only mean the first element, the second element or the third element, respectively, but also mean all combinations presented by two or more of the first element, the second element and the third element.

Features of various aspects of the present disclosure may be partially or wholly coupled to or combined with each other, and may be variously inter-operated with each other and driven technically as those skilled in the art may sufficiently understand. The aspects of the present disclosure may be carried out independently from each other, or may be carried out together in a co-dependent manner.

In the drawings, wherever possible, the same elements will be denoted by the same reference numerals throughout the drawings even though they are depicted in different drawings. Further, the elements illustrated in the accompanying drawings may have scales different from the actual scales thereof for convenience of explanation, and are thus limited by the scales illustrated in the drawings.

Hereinafter, a light emitting display device according to aspects of the present disclosure will be described in detail with reference to the accompanying drawings.

Figure 2:
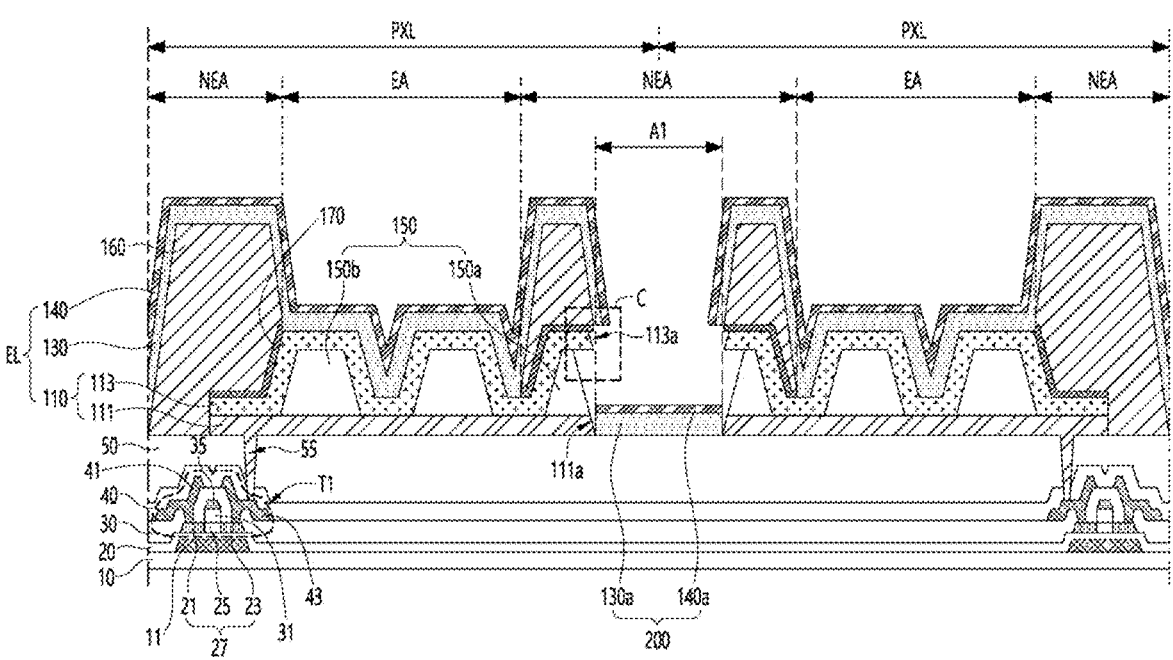
FIG. 2 is a cross-sectional view taken along line I-I' in FIG. 1.

FIG. 1 is a plan view of a light emitting display device 1000 according to an aspect of the present disclosure, and FIG. 2 is a cross-sectional view taken along line I-I' in FIG. 1.

Referring to FIGS. 1 and 2, the light emitting display device 1000 according to an aspect of the present disclosure includes a plurality of sub-pixels PXL each including an emission area EA and a non-emission area NEA, an anode 110 provided at each of the plurality of sub-pixels PXL while including a first transparent electrode 111 and a second transparent electrode 113 provided to overlap with the emission area EA and a portion of the non-emission area NEA, a plurality of protrusion patterns 150 provided inside an edge line 113*a* of the second transparent electrode 113 between the first transparent electrode 111 and the second transparent electrode 113, a bank 160 configured to expose the emission area EA and a first area A1 of the non-emission area NEA, and a barrier layer 170 provided between the second transparent electrode 113 and the bank 160.

A substrate 10 is defined to have an active area in which a screen is displayed, and a non-active area in which no screen is displayed. The active area may be constituted by a plurality of sub-pixels PXL. The plurality of sub-pixels may each be constituted by an emission area EA, which is an area actually emitting light, and a non-emission area NEA, which is an area disposed around the emission area EA. The plurality of sub-pixels PXL may include emission areas EA having different sizes, respectively. The emission areas EA may form unit pixels constituted by red, green, and blue, respectively. For example, when the emission areas EA are unit pixels constituted by red, green, and blue, respectively, the blue emission area EA may have a greater area than those of the red and green emission areas EA because the blue emission area EA has lower luminous efficacy than those of the red and green emission areas EA. Meanwhile, the non-emission area NEA including the first area A1 is provided between two adjacent sub-pixels PXL. That is, the first area A1 may be provided to overlap with a portion of the non-emission area NEA of each of the two adjacent sub-pixels PXL.

In the case, when the substrate 10 is a plastic substrate, the substrate 10 may include polyimide or polyamide. In addition, a circuit device including various signal lines for a data signal and a gate signal, transistors such as a switching thin film transistor and a driving thin film transistor, a capacitor, etc. is formed on the substrate 10 in each sub-pixel PXL. The transistors such as the switching thin film transistor and the driving thin film transistor may be provided in a thin film transistor area TFT which is an area of the non-emission area NEA other than the first area A1 and does not overlap with the emission area EA. In the aspect of the present disclosure, for convenience of description, only one thin film transistor T1, which drives one emission area EA, is shown.

The thin film transistor T1 includes an active layer 27, a gate electrode 35 overlapping with a channel region 25 of the active layer 27 under the condition that a gate insulating layer 31 is interposed therebetween, and a source electrode 41 and a drain electrode 43 connected to opposite sides of the active layer 27, respectively.

The active layer 27 of the thin film transistor T1 includes a source region 21 and a drain region 23 at opposite sides of the channel region 25 under the condition that the channel region 25 is interposed therebetween. Each of the source region 21 and the drain region 23 is formed of a semiconductor material doped with an n-type impurity or a p-type impurity. The channel region 25 overlapping with the gate electrode 35 may be formed of a semiconductor material not doped with an n-type impurity or a p-type impurity.

The gate electrode 35 of the thin film transistor T1 is provided to overlap with the channel region 25 of the active layer 27 while having the same width under the condition that the gate insulating layer 31 is interposed therebetween. The gate insulating layer 31 has the same pattern as that of the gate electrode 35, and overlaps with the channel region 25 of the active layer 27. For example, the gate electrode 35 may be a single layer or multiple layers made of one of molybdenum (Mo), aluminum (Al), chromium (Cr), gold (Au), titanium (Ti), nickel (Ni), neodymium (Nd), and copper (Cu), or an alloy thereof. Meanwhile, the gate insulating layer 31 may be made of an inorganic insulating material. For example, the gate insulating layer 31 may be constituted by a silicon oxide ($SiO_x$) layer, a silicon nitride ($SiN_x$) layer, a silicon oxynitride ($SiO_xN_y$) layer, or multiple layers thereof.

A light shielding layer 11 on the substrate 10 is disposed under the active layer 27 while overlapping with at least the channel region 25 of the active layer 27 of the thin film transistor T1. The light shielding layer 11 prevents external light from being transmitted to the thin film transistor T1 after passing through the substrate 10. For example, the light shielding layer 11 may be constituted by a single layer of one of metal materials such as molybdenum (Mo), titanium (Ti), aluminum-neodymium (AlNd), aluminum (Al), chromium (Cr), or an alloy thereof, or may be constituted by a multilayer structure using the metal materials.

A buffer layer 20 on the light shielding layer 11 is provided to cover the light shielding layer 11. For example, the buffer layer 20 may be constituted by a single-layer structure or a multilayer structure made of silicon oxide ($SiO_x$) or silicon nitride ($SiN_x$).

An interlayer insulating layer 30 on the buffer layer 20 may include a source contact hole and a drain contact hole respectively exposing the source region 11 and the drain region 23 of the active layer 27, and may be provided to cover the gate insulating layer 31 and the gate electrode 35. For example, the interlayer insulating layer 30 may be made of an inorganic insulating material. For example, the interlayer insulating layer 30 may be constituted by a single layer or multiple layers of a silicon oxide ($SiO_x$) layer, a silicon nitride ($SiN_x$) layer or a silicon oxynitride ($SiO_xN_y$) layer.

The source electrode 41 and the drain electrode 43 may be provided on the interlayer insulating layer 30, to form the same layer. The source electrode 41 and the drain electrode 33 are connected to the source region 21 and the drain region 23 of the active layer 27 via the source contact hole and the drain contact hole, respectively. For example, each of the source electrode 41 and the drain electrode 43 may be constituted by a single layer made of one of metal materials such as molybdenum (Mo), aluminum (Al), chromium (Cr), gold (Au), titanium (Ti), nickel (Ni), neodymium (Nd), and copper (Cu), or an alloy thereof, or may be constituted by a multilayer structure using the metal materials.

A passivation layer 40 on the interlayer insulating layer 30 may be provided to cover the thin film transistor area TFT. Accordingly, the thin film transistor area TFT may be protected by the passivation layer 40. For example, the passivation layer 40 is a kind of inorganic insulating layer, and may be constituted by a single layer or multiple layers of a silicon oxide ($SiO_x$) layer, a silicon nitride ($SiN_x$) layer, or a silicon oxynitride ($SiO_xN_y$) layer.

A planarization layer 50 may be provided on the passivation layer 40. The planarization layer 50 is formed to have a thickness capable of sufficiently planarizing upper surface steps of the thin film transistor area TFT, and may be formed of an organic insulating layer. In some cases, the passivation layer 40 may be omitted when the planarization layer 50 also functions to protect the thin film transistor T1. For example, the planarization layer 50 may a single layer of an organic insulating layer that may be made of one of photoacryl, polyimide, benzocyclobutene series resin, and acrylate, etc. Alternatively, the planarization layer 50 may be formed of multiple layers.

A light emitting element EL, which is constituted by a stack structure of an anode 110, an intermediate layer 130, and a cathode 140, is provided on the planarization layer 50. The anode 110 of the light emitting element EL is connected to the drain electrode 43 of the thin film transistor T1 disposed thereunder via an anode contact hole 55. When current supplied from a supply voltage line flows through the cathode 140, and high-voltage current is supplied to the anode 110 from the thin film transistor T1, an electric field is formed between the anode 110 and the cathode 140 and, as such, the intermediate layer 130 emits light that functions as a light emission layer.

In detail, the anode 110 may be provided at each of the plurality of sub-pixels PXL, and may contact a boundary of the first area A1 of the non-emission area NEA while overlapping with the emission area EA and a portion of the non-emission area NEA. In the non-emission area NEA, the anode 110 may be connected to at least one thin film transistor T1 in the thin film transistor area TFT via the anode contact hole 55. For example, the anode 110 may be formed of a transparent conductive material such as indium tin oxide (ITO) and indium zinc oxide (IZO), or may be formed of silver (Ag), aluminum (Al), magnesium (Mg), calcium (Ca), or an alloy thereof while having a small thickness enabling passage of light therethrough.

The anode 110 may be constituted by a first transparent electrode 111, and a second transparent electrode 113 disposed on the first transparent electrode 111 while overlapping with the first transparent electrode 111. A portion of an edge of each of the first transparent electrode 111 and the second transparent electrode 113 may contact the boundary of the first area A1. In detail, an edge line 111a of the first transparent electrode 111 and an edge line 113a of the second transparent electrode 113, which are respective side surfaces of the first transparent electrode 111 and the second transparent electrode 113 adjacent to the first area A1, may contact the boundary of the first area A1. Here, the boundary of the first area A1 means an edge of an area exposed by the bank 160 in the non-emission area NEA, as shown in FIG. 1, and may include an edge of the first area A1 contacting the edge lines 111*a* and 113*a* of the first and second transparent electrodes 111 and 113.

In addition, respective edges of the first transparent electrode 111 and the second transparent electrode 113 may be tapered, as shown by the edge line 111*a* of the first transparent electrode 111 and the edge line 113*a* of the second transparent electrode 113 in FIG. 2. Accordingly, the tapered edge lines 111*a* and 113*a* of the first and second transparent electrodes 111 and 113 may form undercuts under the bank 160, respectively and, as such, may assist in disconnection of a layer deposited over the bank 160. Of course, the edge lines 111*a* and 113*a* of the first and second transparent electrodes 111 and 113 are not limited to the above-described conditions, and may be formed to be substantially vertical, similarly to edge lines opposite thereto.

In the light emitting display device 1000 according to the aspect of the disclosure, it may be possible to disconnect a layer deposited on the second transparent electrode 113 by providing the plurality of protrusion patterns 150 between the first transparent electrode 111 and the second transparent electrode 113. Thereby, the plurality of protrusion patterns 150 may form an undercut under the second transparent electrode 113, as will be described later, even when the first transparent electrode 111 and the second transparent electrode 113 do not have a taper for formation of an undercut.

In this case, the second transparent 113 may have a smaller thickness than at least a thickness of the plurality of protrusion patterns 150. The second transparent electrode 113, which has a small thickness, may cover a surface of each of the plurality of protrusion patterns 150 while maintaining a protrusion shape of the plurality of protrusion patterns 150. Accordingly, the second transparent electrode 113 may be provided along the surfaces of the plurality of protrusion patterns 150 and an area among the plurality of protrusion patterns 150 where no protrusion pattern 150 is formed.

The first transparent electrode 111 and the second transparent electrode 113 may contact each other in the area where no protrusion pattern 150 is formed. The first transparent electrode 111 may be connected to the thin film transistor T1 thereunder via the anode contact hole 55. In the light emitting display device 1000 according to the aspect of the disclosure, accordingly, the first transparent electrode 111 and the second transparent electrode 113 may simultaneously receive current from the thin film transistor T1 via the anode contact hole 55 because the first transparent electrode 111 and the second transparent electrode 113 are interconnected. The first transparent electrode 111 and the second transparent electrode 113 as described above may be formed of the same material. However, the present disclosure is not limited to the above-described conditions, and the first transparent electrode 111 and the second transparent electrode 113 may be formed of different transparent conductive materials, respectively.

The plurality of protrusion patterns 150 between the first transparent electrode 111 and the second transparent electrode 113 may be provided inside the edge of the second transparent electrode 113. In particular, among the plurality of protrusions 150, a first protrusion pattern 150*a* adjacent to the first area A1 may be provided in plural in a direction parallel to the first area A1, as shown in FIG. 1. In addition, the first protrusion pattern 150*a* may have a size different from that of a second protrusion pattern 150*b* spaced apart from the first area A1 under the condition that the first protrusion pattern 150*a* is disposed therebetween. Accordingly, the first protrusion pattern 150*a* provided inside the edge line 113*a* of the second transparent electrode 113 may form an undercut under the second transparent electrode 113, as shown by an area C in FIG. 2. In the light emitting display device 1000 according to the aspect of the disclosure, accordingly, the intermediate layer 130 on the second transparent electrode 113 is disconnected by the undercut of the second transparent electrode 113 and, as such, an effect of preventing leakage current from flowing between the adjacent sub-pixels may be provided. In other words, the plurality of protrusion patterns 150 functions as a light emission enhancing dots for the light emitting display device as described below in more details.

The shape of the plurality of protrusion patterns 50 may be a hexahedron having a trapezoidal cross-sectional shape in which a lower edge is wider than an upper edge. However, the plurality of protrusion patterns 150 is not limited to the above-described shape, and may have, for example, a frustoconical shape having a trapezoidal cross-sectional shape while having an area gradually increasing as the frustoconical shape extends downwards.

The plurality of protrusion patterns 150 may be formed of an inorganic insulating material such as $SiO_2$. The plurality of protrusion patterns 150 formed of the inorganic insulating material may have a lower refractive index than those of the first transparent electrode 111 and the second transparent electrode 113. In this case, light not emitted toward the substrate 10 after being generated from the intermediate layer 130 is reflected by the cathode 140 disposed at an upper side and, as such, is discharged through the substrate 10 or advances toward the bank 160 and the protrusion patterns 150 in a lateral direction.

Figure 3:
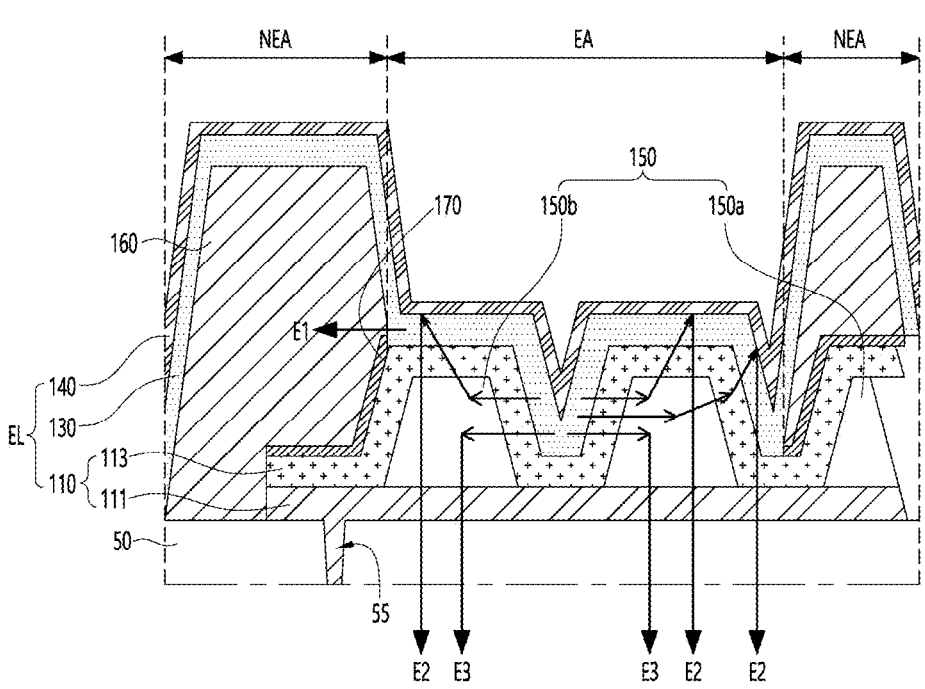
FIG. 3 is a cross-sectional view showing a light path in a light emitting element shown in FIG. 2.

Referring to FIG. 3, light E1 incident upon the bank 160 without passing through the protrusion patterns 150 may disappear, but light E2 and light E3 incident upon side surfaces of the protrusion patterns 150 is refracted upwards and downwards due to a refractive index difference between the protrusion patterns 150 and each of the first and second transparent electrodes 111 and 113. Accordingly, the light E3 refracted downwards toward the first transparent electrode 111 after being incident upon the side surfaces of the protrusion patterns 150 may be emitted outwards through the substrate 10. In addition, the light E2 refracted upwards toward the second transparent electrode 113 after being incident upon the side surfaces of the protrusion patterns 150 may be reflected by the cathode 140, which is a reflective electrode, and may then be emitted outwards through the substrate 10. That is, in the light emitting display device 1000 according to the aspect of the disclosure, the light emitted from the intermediate layer 130 is refracted by the protrusion patterns 150 without disappearing during advance thereof to the bank 160, and is then discharged to the substrate 10. Accordingly, an effect of achieving an enhancement in luminous efficacy may be provided.

The bank 160 may be provided on the second transparent electrode 113 under the condition that the barrier layer 170 is interposed therebetween. The barrier layer 170 may be provided between the second transparent electrode 113 and the bank 160 while covering an upper surface of a portion of the second transparent electrode 113 disposed in the non-emission area NEA. The barrier layer 170 may perform both a mask function in a processing procedure and a function for protecting the anode 110 and the plurality of protrusion patterns 150 from an etching gas used in formation of the first protrusion pattern 150*a*. The barrier layer 170 as described above may be formed of a material different from those of the first transparent electrode 111 and the second transparent electrode 113. For example, the barrier layer 170 may be configured through inclusion of one of molybdenum-titanium (MoTi), titanium (Ti), aluminum (Al), chromium (Cr), gold (Au), and platinum (Pt).

The bank 160 may be provided on the planarization layer 50 and the barrier layer 170, to expose the emission area EA and the first area A1 of the non-emission area NEA. That is, the bank 160 may cover an upper portion of an edge of the anode 110, to define the emission area EA of the anode 110 and may cover the thin film transistor area TFT provided at the non-emission area NEA. Here, the bank 160 may expose at least the edge line 113a of the second transparent electrode 113 contacting the boundary of the first area A1 by exposing the first area A1. In the aspect of the present disclosure, accordingly, it may be possible to disconnect layers deposited on the bank 160 in an undercut area of the second transparent electrode 113 as shown by the area C in FIG. 2.

In addition, the bank 160 may be tapered at a greater inclination than at least an inclination of a side surface of the second protrusion pattern 150b provided in the emission area EA. The side surface of the bank 160, which has a great inclination, causes the intermediate layer 130, which has degraded step coverage characteristics, to be thinly deposited. By virtue of the side surface of the bank 160 as described above, the intermediate layer 130 is thinly formed on the side surface of the bank 160 during formation thereof on the entire surface of the substrate 10 using a common mask and, as such, separation of the intermediate layer 130 may be easily achieved when the intermediate layer 130 extends from the side surface of the bank 160 to the first area A1.

The intermediate layer 130 may be provided on the second transparent electrode 113 and the bank 160. The intermediate layer 130 may mean an organic layer having a single stack structure constituted by multiple layers including a hole injection layer HIL, a hole transport layer HTL, an emission layer EML, an electron transport layer ETL, and an electron injection layer EIL. Here, the emission layer EML may be an emission layer configured to emit light of one of red, green and blue, and may be partially provided at each of a plurality of sub-pixels PXL. The plurality of layers of the intermediate layer 130, except for the emission layer EML, may be provided on the entire surface of the substrate 10 using a common mask. In addition, the intermediate layer 130 may mean a tandem structure including a plurality of stacks including a first stack and a second stack, and a charge generation layer CGL disposed among the stacks. Here, the charge generation layer CGL may be constituted by a double layer of an n-type layer and a p-type layer. In addition, the tandem structure may be multiple stacks including three stacks or more without being limited to the shown double stack structure. The n-type charge generation layer and the p-type charge generation layer of the charge generation layer CGL as described above may include an n-type dopant and a p-type dopant, respectively. For example, a metal dopant such as lithium (Li), ytterbium (Yb), or the like may be included in the n-type dopant. Such a metal dopant may cause an increase in charge mobility and, as such, may cause generation of leakage current between adjacent sub-pixels when the n-type charge generation layer is formed at a plurality of sub-pixels in common. In addition to the n-type charge generation layer, the layers of the intermediate layer 130 including a material exhibiting high charge mobility may cause generation of leakage current.

However, the intermediate layer 130 in the light emitting display device 1000 according to the aspect of the present disclosure may be disconnected by the undercut area under the second transparent electrode 113, as shown by the area C in FIG. 2. Accordingly, among the common layers of the intermediate layer 130, the layers exhibiting high charge mobility may be separated in the first area A1 of the non-emission area NEA between the adjacent sub-pixels PXL in accordance with the aspect of the present disclosure and, as such, it may be possible to prevent leakage current from flowing between the adjacent sub-pixels PXL via the intermediate layer 130. In the aspect of the present disclosure, accordingly, a dummy pattern 200, which includes an intermediate layer dummy pattern 130a separated from the intermediate layer 130 on the bank 160 while being disposed on the same layer as the intermediate layer 130, may be formed on the planarization layer 50 in the first area A1.

The cathode 140 may be provided on the intermediate layer 130. The cathode 140 may be formed to have a multilayer structure including a transparent conductive layer and an opaque conductive layer having a high reflection efficiency. The transparent conductive layer of the cathode 140 is made of a material having a relativity high work function such as indium tin oxide (ITO) or indium zinc oxide (IZO), and the opaque conductive layer of the cathode 140 may be constituted by a single layer or multiple layers of one selected from the group consisting of silver (Ag), aluminum (Al), copper (Cu), molybdenum (Mo), titanium (Ti), nickel (Ni), chromium (Cr), and tungsten (W), or an alloy thereof. For example, the cathode 140 may be formed by a structure in which a transparent conductive layer, an opaque conductive layer, and a transparent conductive layer are sequentially stacked, or may be formed by a structure in which a transparent conductive layer and an opaque conductive layer are sequentially stacked.

The cathode 140 may be formed on the entire surface of the substrate 10 through a common mask. Although the cathode 140, which is made of a metal, may be thinly formed at the side surface of the bank 160 tapered at a great inclination, as compared to a flat surface of the bank 160, the cathode 140 may be continuously formed to extend up to a certain side surface after extending along the side surface of the bank 160 because the cathode 140 has excellent step coverage characteristics. That is, although the cathode 140 is shown in FIG. 2 as being disconnected after extending along the side surface of the bank 160, the cathode 140 may be formed to extend up to the side surface of the second transparent electrode 113 after extending along the side surface of the bank 160. Of course, the cathode 140 may be disconnected in at least the undercut area of the second transparent electrode 113, as shown by the area C in FIG. 2. Accordingly, the cathode 140 may be separated from the bank 160 into the first area A1 and, as such, the dummy pattern 200 may include a cathode dummy pattern 140a disposed on the same layer as the cathode 140.

FIGS. 4A to 4J are process cross-sectional views corresponding to FIG. 2.

Figure 4A:
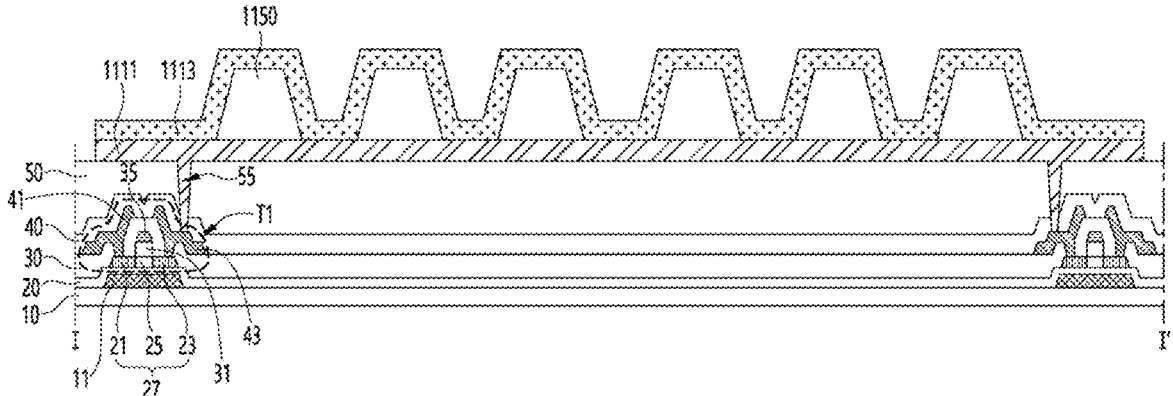
FIG. 4A to 4J are cross-sectional views for manufacturing the light emitting display device shown in FIG. 2.

Referring to FIG. 4A, a planarization layer 50 covering a thin film transistor T1 and a light emitting element EL is formed on a substrate 10. In detail, a buffer layer 20 is formed on the substrate 10 formed with a light shielding layer 11, and an active layer 27 is formed on the buffer layer 20 through a mask process. Thereafter, a gate insulating layer 31 and a gate electrode 35 are simultaneously formed on the buffer layer 20 formed with the active layer 27 through a mask process. Subsequently, an interlayer insulating layer 30 including source and drain contact holes is formed on the gate electrode 35 through a mask process. Next, source/drain electrodes 41 and 43 are formed on the substrate 10 formed with the interlayer insulating layer 30 through a mask process. A passivation layer 40 and the planarization layer 50 including an anode contact hole 55 are then sequentially formed on the interlayer insulating layer 30 formed with the source/drain electrodes 41 and 43 through a mask process.

A first transparent electrode material 1111 is formed on the entire surface of the planarization layer 50 through a mask process. And then, a plurality of protrusion patterns 1150 is formed on the first transparent electrode material 1111 through a mask process. And then, a second transparent electrode material 1113 is formed on the first transparent electrode material 1111 and the plurality of protrusion patterns 1150, to overlap with the first transparent electrode 1111 through a mask process. The second transparent electrode material 1113 is formed to have a smaller thickness than at least a thickness of the protrusion patterns 1150 and, as such, may be formed along a surface profile of the protrusion patterns 1150. In addition, the plurality of protrusion patterns 1150 may be formed inside respective edges of the first transparent electrode material 1111 and the second transparent electrode material 1113.

Figure 4B:
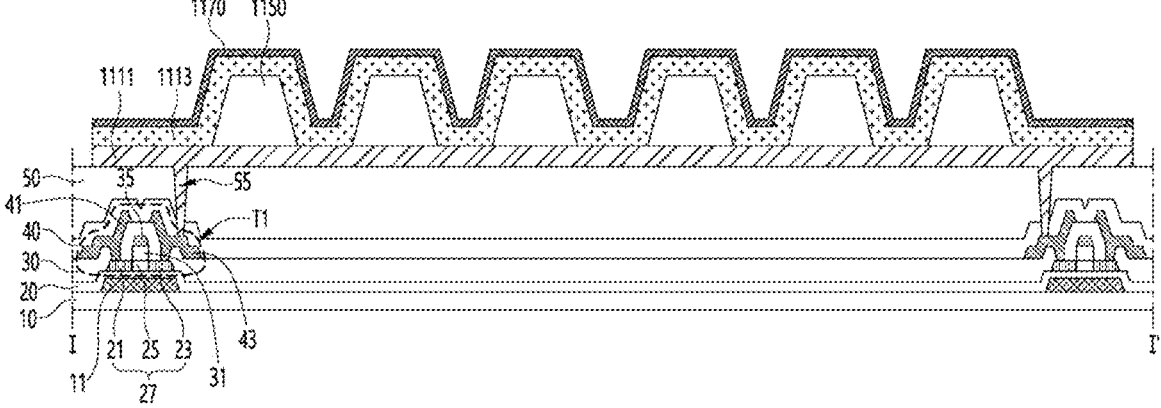

Thereafter, referring to FIG. 4B, a barrier material layer 1170 may be formed on the second transparent electrode material 1113, to overlap with the second transparent electrode material 1113.

Figure 4C:
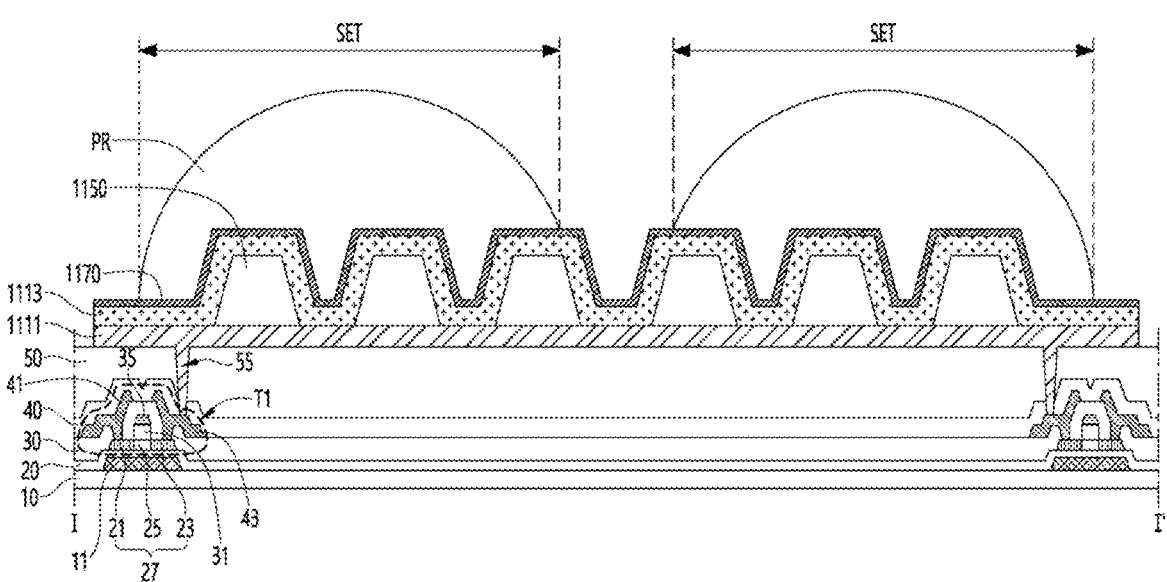

Subsequently, referring to FIG. 4C, a photoresist layer PR may be formed on the barrier material layer 1170 through a mask process such that the photoresist layer PR is disposed within a predetermined area SET. The predetermined area SET of the photoresist layer PR may be an area where an anode 110 included in each of a plurality of sub-pixels PXL will be disposed.

Figure 4D:
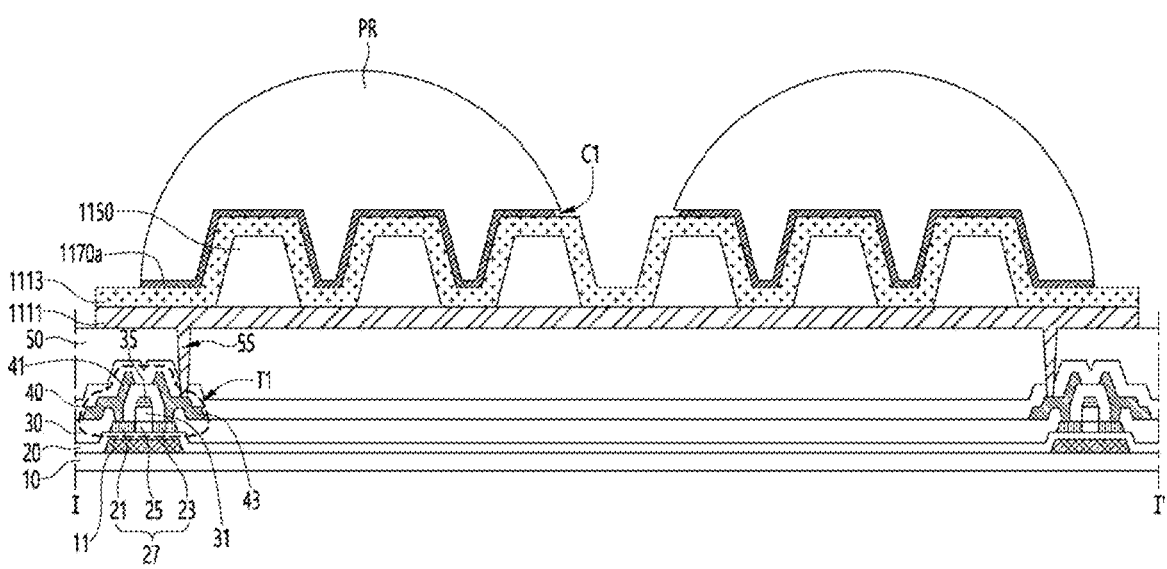

Next, referring to FIG. 4D, the barrier material layer 1170 is patterned using the photoresist layer PR as a mask, thereby forming a barrier material pattern 1170a. In this case, in the mask process, the barrier material pattern 1170a may be formed through wet etching. In some cases, the barrier material pattern 1170a may be formed to have a taper taking the form of an undercut under the photoresist layer PR in accordance with an etching gas, as shown in an area C1. Of course, the present disclosure is not limited to the above-described condition, and a side surface of the barrier material pattern 1170a may be formed to be vertical in accordance with a processing method.

Figure 4E:
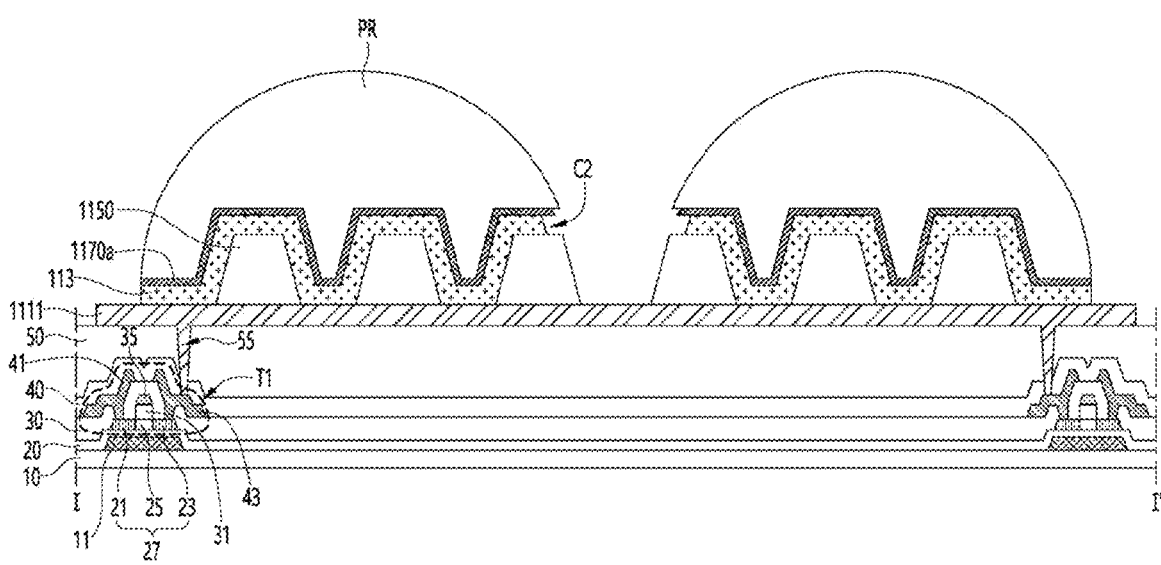

Thereafter, referring to FIG. 4E, the second transparent electrode material 1113 is patterned using the photoresist layer PR as a mask, thereby forming a second transparent electrode 113. In this case, in the mask process, the second transparent electrode 113 may be formed through wet etching using a gas mixture of hydrochloric acid (HCl) and phosphoric acid ($H_3PO_4$). In some cases, the second transparent electrode 113 may be formed to have a taper taking the form of an undercut under the barrier material pattern 1170a, as shown in an area C2. Of course, the present disclosure is not limited to the above-described condition, and a side surface of the second transparent electrode 113 may be formed to be vertical in accordance with a processing method.

In addition, when the first transparent electrode material 1111 is made of the same material as that of the second transparent electrode material 1113, a portion of the first transparent electrode material 1111 contacting the second transparent electrode material 1113 may be removed in the mask process for formation of the second transparent electrode 1113. In this case, the degree of etching is set such that the thickness of the second transparent electrode material 1113 is etched and, as such, the first transparent electrode material 1111 may remain on the planarization layer 50 without being completely etched together with the second transparent electrode material 1113.

In addition, an edge of the second transparent electrode 113 adjacent to an area between two adjacent portions of the photoresist layer PR may be formed to extend up to an upper surface of the protrusion pattern 1150 in the area between the adjacent portions of the photoresist layer PR. Accordingly, the protrusion pattern 1150 disposed in the area between the adjacent portions of the photoresist layer PR may be partially exposed from the second transparent electrode 113. Meanwhile, the second transparent electrode 113 extends to an area where no protrusion pattern 1150 is formed after extending along surfaces of the protrusion patterns 1150. In this state, an edge of the second transparent electrode 113 other than the edge adjacent to the area between the adjacent portions of the photoresist layer PR may continuously contact the first transparent electrode material 1111 in the area where no protrusion pattern 1150 is formed.

Figure 4F:
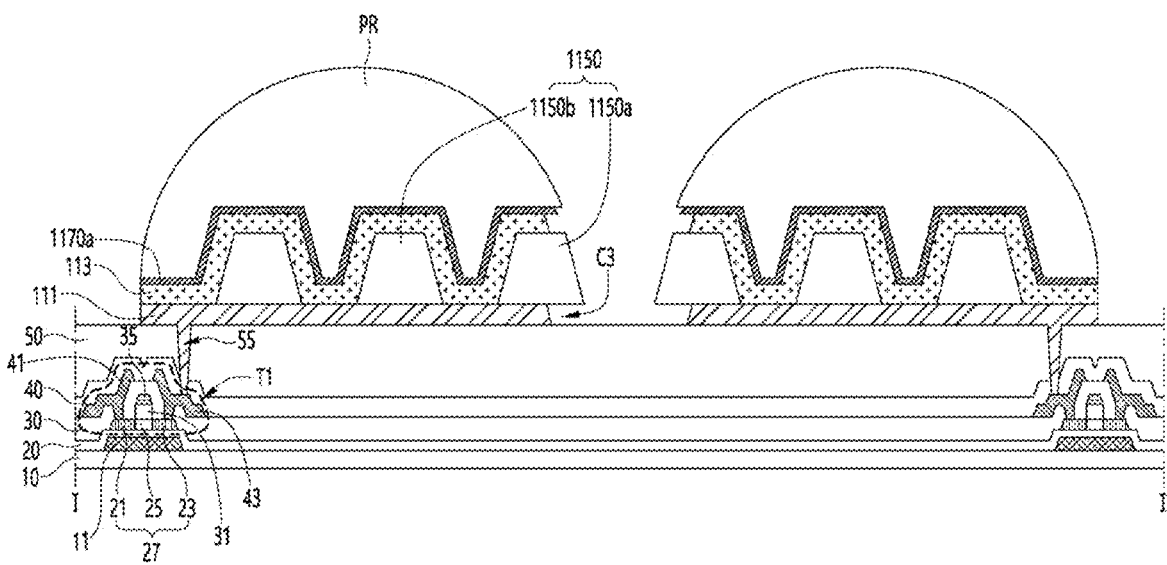

Referring to FIG. 4F, the first transparent electrode material 1111 is patterned using the photoresist layer PR as a mask, thereby forming a first transparent electrode 111. In this case, when the first transparent electrode 111 is formed of the same material as that of the second transparent electrode 113, the mask process for formation of the first transparent electrode 111 may use an etching gas identical to an etching gas used in the mask process for formation of the second transparent electrode 113. In some cases, the first transparent electrode 111 may be formed to have a taper taking the form of an undercut under the protrusion pattern 1150, as shown in an area C3. Of course, the present disclosure is not limited to the above-described condition, and a side surface of the first transparent electrode 111 may be formed to be vertical in accordance with a processing method.

In addition, in the process of FIG. 4F, among the plurality of protrusion patterns 1150, a primary protrusion pattern 1150a protruding outwards beyond edges of the first transparent electrode 111 and the second transparent electrode 113 may be exposed. That is, the first transparent electrode material 1111 and the second transparent electrode material 113 may be patterned up to upper and lower surfaces of the primary protrusion pattern 1150a disposed in the area between the adjacent portions of the photoresist layer PR, respectively, and, as such, the primary protrusion pattern 1150a may be formed to protrude outwards beyond the first transparent electrode 111 and the second transparent electrode 113. Meanwhile, each of the plurality of protrusion patterns 1150, except form the primary protrusion pattern 1150a, that is, each protrusion pattern 1150b, may contact the first transparent electrode 111 and the second transparent electrode 113 at a lower surface thereof and a remaining surface thereof, respectively.

Figure 4G:
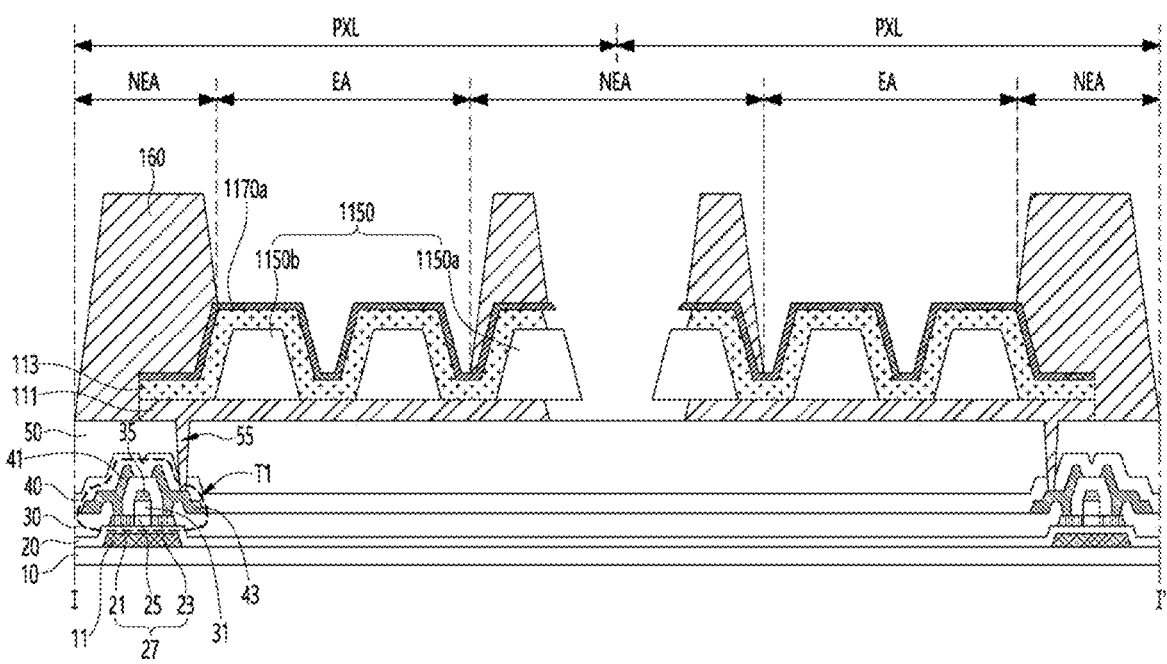

Subsequently, referring to FIG. 4G, the photoresist layer PR may be stripped, and a bank 160 may then be formed through a mask process. The bank 160 may be formed to expose an emission area EA and a first area A1 of a non-emission area NEA in each of a plurality of sub-pixels PXL. In addition, through exposure of the first area A1, the bank 160 may be formed to expose an edge of the barrier material pattern 1170a overlapping with a boundary of the first area A1.

Figure 4H:
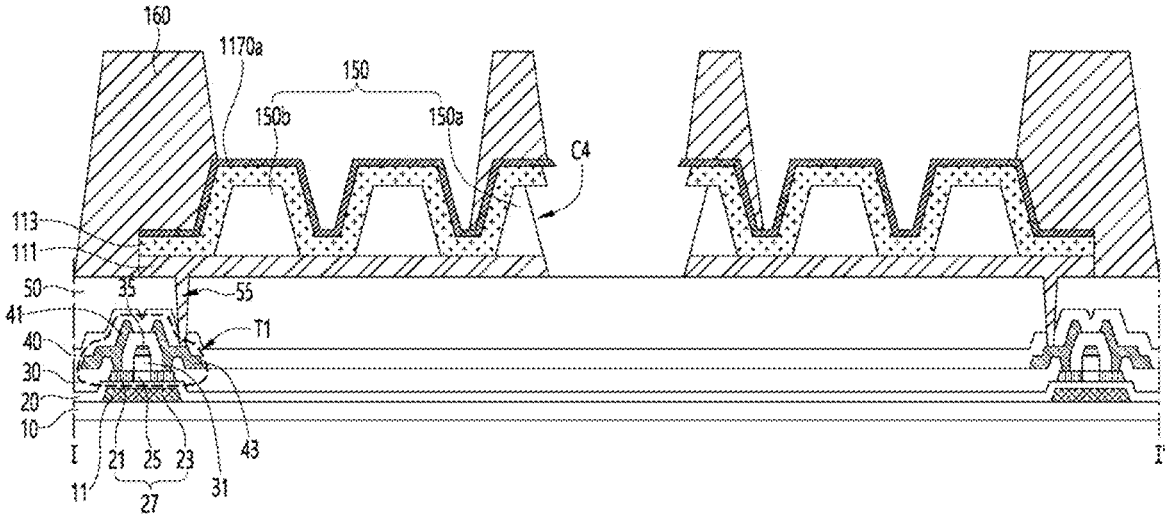

Next, referring to FIG. 4H, the primary protrusion pattern 1150a protruding outwards beyond the edge of the second transparent electrode 113 may be etched using the barrier material pattern 1170a as a mask, thereby forming a first protrusion pattern 150a. The first protrusion pattern 150a is formed inside the edge line of the second transparent electrode 113, as shown in an area C4, and, as such, an undercut of the second transparent electrode 113 may be formed. Accordingly, the first protrusion pattern 150a may be formed to have a size different from that of a second protrusion pattern 150b covered by the second transparent electrode 113. The plurality of protrusion patterns 150 including the first protrusion pattern 150a and the second protrusion pattern 150b as described above may achieve an enhancement in light extraction efficiency in the present disclosure, and may achieve formation of an undercut under the second transparent electrode 113.

Meanwhile, in the process of FIG. 4H, the barrier material pattern 1170a may not only function as a mask for etching the primary protrusion pattern 1150a, but also have a function for preventing damage to the first transparent electrode 111 and the second transparent electrode 113 during etching of the primary protrusion pattern 1150a.

Figure 4I:
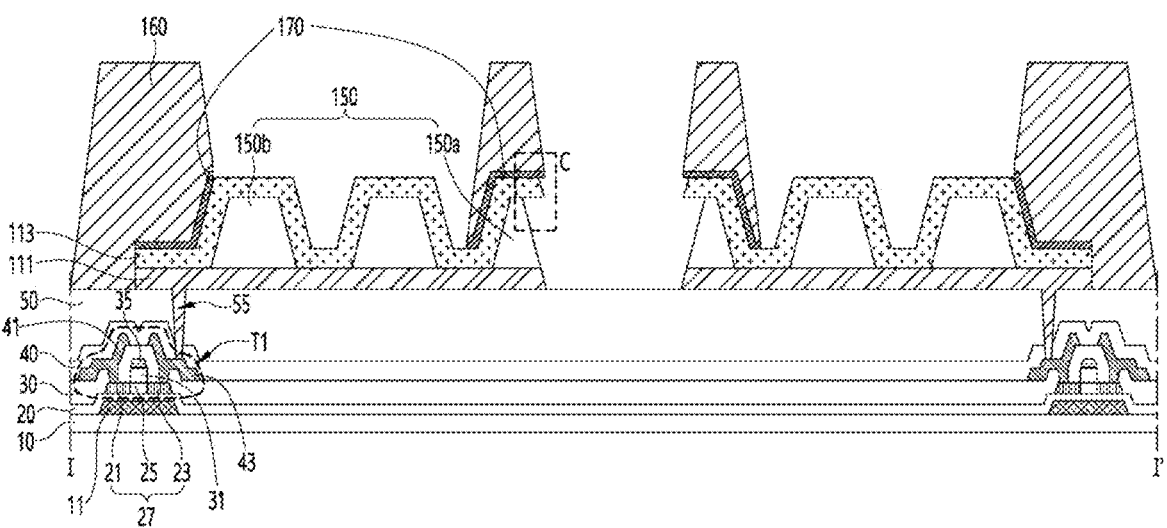

Thereafter, referring to FIG. 4I, the barrier material pattern 1170a may be patterned using the bank 160 as a mask. Accordingly, a portion of the barrier material pattern 1170a exposed through the bank 160 may be removed and, as such, a barrier layer 170 may be formed in an area where the second transparent electrode 113 and the bank 160 overlap with each other.

Figure 4J:
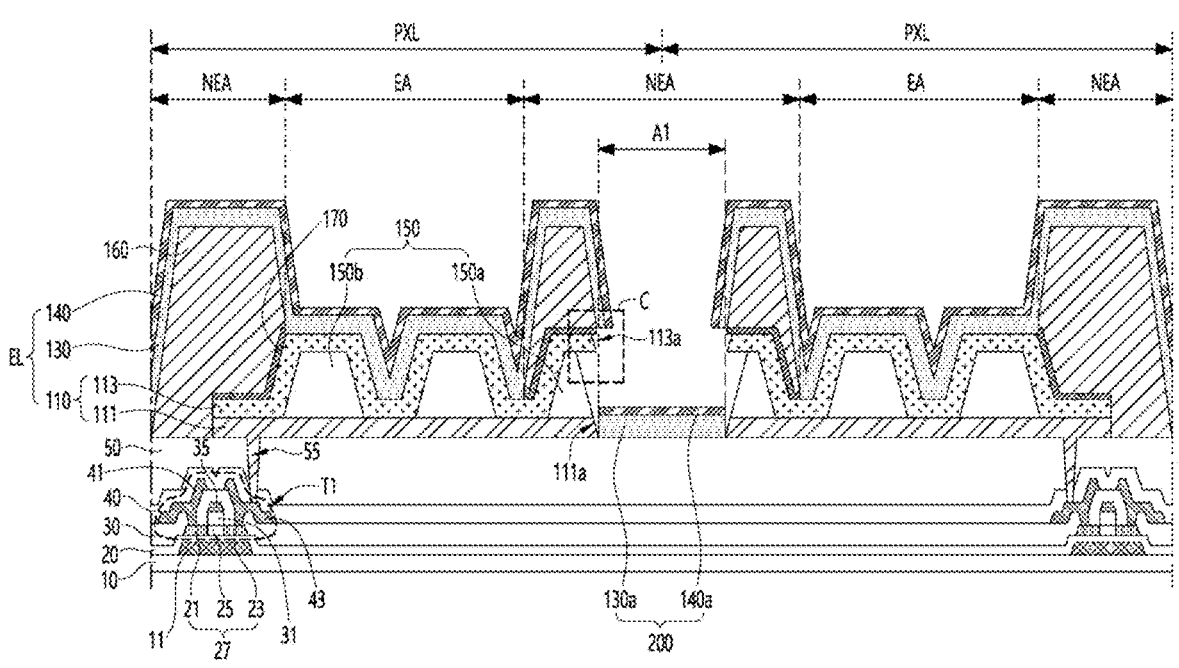

Subsequently, referring to FIG. 4J, an intermediate layer 130 and a cathode 140 may be sequentially formed over the entire surface of the substrate 10. Each of the intermediate layer 130 and the cathode 140 may be separated from a side surface of the bank 160 into the first area A1 by virtue of the undercut formed by the first protrusion pattern 150a under the second transparent electrode 113. Accordingly, a dummy pattern 200, which is constituted by a stack structure of an intermediate dummy pattern 130a and a cathode dummy pattern 140a respectively forming the same layers as the intermediate layer 130 and the cathode 140, may be formed in the first area A1.

Thus, the light emitting display device according to the aspect of the present disclosure may have an effect of enhancing luminous efficacy of the emission area EA by forming the plurality of protrusion patterns 150 between the anode 110 of the light emitting element EL included in each of the sub-pixels PXL and the intermediate layer 130, thereby allowing light not discharged outwards after being emitted from the intermediate layer 130 to be discharged outwards after being refracted by the plurality of protrusion patterns 150.

At the same time, the light emitting display device according to the aspect of the present disclosure may have an effect of preventing leakage current from flowing between adjacent ones of the sub-pixels PXL through the intermediate layer 130 by forming the plurality of protrusion patterns 150 between the first transparent electrode 111 and the second transparent electrode 113 of the anode 110 included in each of the sub-pixels PXL, and forming an undercut of the second transparent electrode 113 by the first protrusion pattern 150a disposed under the edge line 113a of the second transparent electrode 113, among the plurality of protrusion patterns 150, thereby enabling the intermediate layer 130 to be separated into the first area A1 by the undercut of the second transparent electrode 113 in the non-emission area NEA.

That is, the light emitting display device according to the aspect of the present disclosure may have both a luminous efficacy enhancement effect and a leakage current prevention effect through provision of the plurality of protrusion patterns 150 between the first transparent electrode 111 and the second transparent electrode 113.

Figure 5:
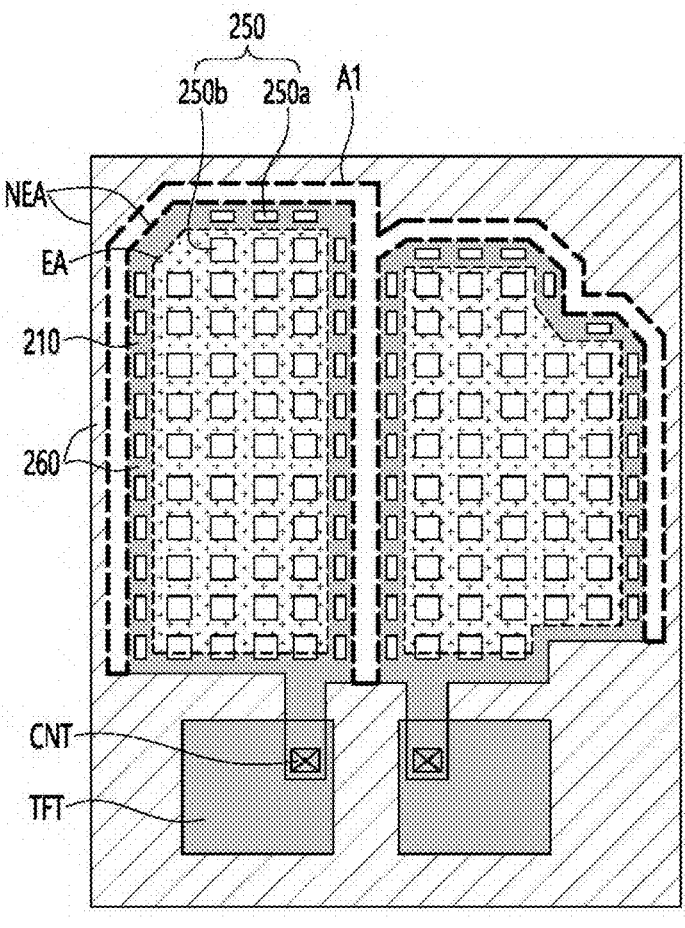
FIG. 5 is a plan view of a light emitting display device according to another aspect of the present disclosure.

FIG. 5 is a plan view of a light emitting display device according to a second aspect of the present disclosure. In accordance with the second aspect of the present disclosure, a first area A1 may be selectively provided along a side surface of an edge of an anode 210. However, the first area A1 may not be provided between the anode 210 and a thin film transistor area TFT. The anode 210 may include a first transparent electrode and a second transparent electrode overlapping with each other, and a plurality of protrusion patterns 250 may be provided between the first transparent electrode and the second transparent electrode.

Among the plurality of protrusion patterns 250, a first protrusion pattern 250a configured to form an undercut under the second transparent electrode may be provided along the edge of the anode 210. That is, the first protrusion pattern 250a may be provided along the edge of the anode 210 contacting a boundary of the first area A1. Accordingly, a second protrusion pattern 250b configured not to form an undercut may be provided between the anode 210 and the thin film transistor area TFT.

A bank 260 may be provided in a non-emission are NEA, to expose an emission area EA and the first area A1 of the non-emission area NEA. As the bank 260 exposes the first area A1 of the non-emission area NEA, an upper surface of the edge of the anode 210 may be hidden, and a side surface of the anode 210 may be exposed. At the same time, the first protrusion pattern 250a under the second transparent electrode of the anode 210 may be exposed in the first area A1.

For example, in the case of a unit sub-pixel in which red and green emission areas are disposed in parallel, and a blue emission area having a greater size than those of the red and green emission areas is disposed under the red and green emission areas, the first area A1 may be provided among the emission areas. That is, in the light emitting display device according to the second aspect of the present disclosure, the first area A1 may be provided between emission areas in which leakage current may be generated. Accordingly, the light emitting display device according to the second aspect of the present disclosure may effectively prevent leakage current from flowing among emission areas EA through selective provision of the first area A1 and the first protrusion pattern 150a adjacent to the first area A1.

As apparent from the above description, the light emitting display device according to each of the aspects of the present disclosure has an effect of enhancing luminous efficacy of an emission area by allowing light not discharged outwards from an intermediate layer to be discharged outwards after being refracted by a plurality of protrusion patterns.

At the same time, in the light emitting display device according to each of the aspects of the present disclosure, the intermediate layer may be separated into a first area by an undercut of a second transparent electrode in a non-emission area between adjacent sub-pixels and, as such, there is an effect of preventing leakage current from flowing between the adjacent sub-pixels through the intermediate layer.

Furthermore, the light emitting display device according to each of the aspects of the present disclosure may achieve both luminous efficacy enhancement and leakage current prevention through provision of a plurality of protrusion patterns between first and second transparent electrodes and, as such, may reduce power consumption and production energy consumption. Thus, the light emitting display device according to each of the aspects of the present disclosure has an environment/social/governance (ESG) effect by virtue of eco-friendly, low power consumption and process optimization advantages.

The light emitting display device according to one aspect of the present disclosure is described as follows.

The light emitting display device according to one aspect of the present disclosure may include a plurality of sub-pixels each including an emission area and a non-emission area, an anode including a first transparent electrode and a second transparent electrode at each of the plurality of sub-pixels, to overlap with the emission area and a portion of the non-emission area, a plurality of protrusion patterns inside an edge line of the second transparent electrode between the first transparent electrode and the second transparent electrode, and a bank to expose the emission area and a first area of the non-emission area.

In the light emitting display device according to one aspect of the present disclosure, the plurality of protrusion patterns includes a plurality of first protrusion patterns provided along the edge line of the second transparent electrode contacting a boundary of the first area.

In the light emitting display device according to one aspect of the present disclosure, the second transparent electrode is provided along surfaces of the plurality of protrusion patterns, except for portions of surfaces of the plurality of first protrusion patterns exposed in the first area, and an area where the plurality of protrusion patterns is not provided.

In the light emitting display device according to one aspect of the present disclosure, the first transparent electrode and the second transparent electrode contact each other at an area where the plurality of protrusion patterns is not provided.

In the light emitting display device according to one aspect of the present disclosure, the plurality of protrusion patterns comprises an organic insulating material.

In the light emitting display device according to one aspect of the present disclosure, the plurality of protrusion patterns has a lower refractive index than a refractive index of each of the first transparent electrode and the second transparent electrode.

In the light emitting display device according to one aspect of the present disclosure, the light emitting display device is further comprising an intermediate layer and a cathode on the second transparent electrode and the bank and a dummy pattern overlapping with the first area, wherein the dummy pattern comprises a material identical to a material of at least the intermediate layer, and is separated from the intermediate layer and the cathode.

In the light emitting display device according to one aspect of the present disclosure, the bank exposes the dummy pattern at the first area.

In the light emitting display device according to one aspect of the present disclosure, the edge line of the first transparent electrode contacts a lower portion of an edge of the dummy pattern.

In the light emitting display device according to one aspect of the present disclosure, the light emitting display device is further comprising a barrier layer between the second transparent electrode and the bank.

In the light emitting display device according to one aspect of the present disclosure, the barrier layer comprises a material different from a material of each of the first transparent electrode and the second transparent electrode.

In the light emitting display device according to one aspect of the present disclosure, the barrier layer comprises one of molybdenum-titanium (MoTi), titanium (Ti), aluminum (Al), chromium (Cr), gold (Au), and platinum (Pt).

In the light emitting display device according to one aspect of the present disclosure, the light emitting display device is further comprising a thin film transistor connected to the first transparent electrode, wherein the thin film transistor is at the non-emission area, except for the first area.

It will be apparent to those skilled in the art that various modifications and variations can be made in the light emitting display device of the present disclosure without departing from the spirit or scope of the aspects. Thus, it is intended that the present disclosure covers the modifications and variations of the aspects provided they come within the scope of the appended claims and their equivalents.

What is claimed is:

1. A light emitting display device comprising:
a plurality of sub-pixels each including an emission area and a non-emission area;
an anode including a first transparent electrode and a second transparent electrode at each of the plurality of sub-pixels and overlapping with the emission area and a portion of the non-emission area;
a plurality of protrusion patterns disposed inside an edge line of the second transparent electrode between the first transparent electrode and the second transparent electrode; and
a bank exposing the emission area and a first area of the non-emission area.

2. The light emitting display device according to claim 1, wherein the plurality of protrusion patterns includes a plurality of first protrusion patterns provided along the edge line of the second transparent electrode contacting a boundary of the first area.

3. The light emitting display device according to claim 2, wherein the second transparent electrode is provided along surfaces of the plurality of protrusion patterns, except for portions of surfaces of the plurality of first protrusion patterns exposed in the first area, and an area where the plurality of protrusion patterns is not provided.

4. The light emitting display device according to claim 1, wherein the first transparent electrode and the second transparent electrode contact each other at an area where the plurality of protrusion patterns is not provided.

5. The light emitting display device according to claim 1, wherein the plurality of protrusion patterns includes an inorganic insulating material.

6. The light emitting display device according to claim 5, wherein the plurality of protrusion patterns has a lower refractive index than that of the first and second transparent electrodes.

7. The light emitting display device according to claim 1, further comprising:
an intermediate layer and a cathode on the second transparent electrode and the bank; and
a dummy pattern overlapping with the first area,
wherein the dummy pattern comprises a material identical to a material of the intermediate layer, and the dummy pattern is separated from the intermediate layer and the cathode.

8. The light emitting display device according to claim 7, wherein the bank exposes the dummy pattern at the first area.

9. The light emitting display device according to claim 7, wherein an edge line of the first transparent electrode contacts a lower portion of an edge of the dummy pattern.

10. The light emitting display device according to claim 1, further comprising a barrier layer between the second transparent electrode and the bank.

11. The light emitting display device according to claim 10, wherein the barrier layer includes a material different from the first and second transparent electrodes.

12. The light emitting display device according to claim 10, wherein the barrier layer includes one of molybdenum-titanium (MoTi), titanium (Ti), aluminum (Al), chromium (Cr), gold (Au), and platinum (Pt).

13. The light emitting display device according to claim 1, further comprising a thin film transistor connected to the first transparent electrode, wherein the thin film transistor is disposed at the non-emission area except for the first area.

14. A light emitting display device comprising:

a plurality of sub-pixels each including an emission area and a non-emission area defined in a substrate;

an anode including a first transparent electrode and a second transparent electrode that have a portion over-lapping in the emission area and the non-emission area;

a light emission layer disposed on the anode; and a plurality of light emission enhancing dots disposed between the first and second transparent electrodes in the emission area and the non-emission area, wherein the plurality of light emission enhancing dots has a refractive index lower than those of the first and second transparent electrodes and refracts light emitted from the light emission layer toward the substrate in the emission area.

15. The light emitting display device according to claim 14, further comprising a bank exposing the emission area and a first area of the non-emission area.

16. The light emitting display device according to claim 15, further comprising a dummy pattern exposed by the first area of the non-emission area.

17. The light emitting display device according to claim 15, wherein the second transparent electrode has an undercut portion in the first area of the non-emission area.

18. The light emitting display device according to claim 15, wherein the light emission layer is disconnected by the first area of the non-emission area.

19. The light emitting display device according to claim 15, wherein the first area of the non-emission area is selectively disposed along a side surface of an edge of the anode.

* * * * *